United States Patent
Park et al.

(10) Patent No.: US 10,087,514 B2
(45) Date of Patent: Oct. 2, 2018

(54) AMORPHOUS AND NANO NITRIDE COMPOSITE THIN FILM, METHOD FOR FORMING THE SAME, AND ELECTRONIC DEVICE HAVING THE SAME

(71) Applicant: SAMSUNG ELECTRONICS CO., LTD., Suwon-si (KR)

(72) Inventors: Eun-soo Park, Suwon-si (KR); Keum-hwan Park, Seoul (KR); Jin-man Park, Seoul (KR); Seok-moo Hong, Seongnam-si (KR); Sung-ho Cho, Anyang-si (KR); Moung-kwan Park, Suwon-si (KR); Jae-won Sim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 86 days.

(21) Appl. No.: 15/007,505

(22) Filed: Jan. 27, 2016

(65) Prior Publication Data
US 2016/0215383 A1    Jul. 28, 2016

(30) Foreign Application Priority Data
Jan. 27, 2015 (KR) .................. 10-2015-0012890

(51) Int. Cl.
*C23C 14/06* (2006.01)
*C23C 14/34* (2006.01)

(52) U.S. Cl.
CPC ...... *C23C 14/0641* (2013.01); *C23C 14/0688* (2013.01); *C23C 14/3414* (2013.01)

(58) Field of Classification Search
USPC .......... 75/244, 245, 246, 252; 428/457, 697, 428/698, 699
See application file for complete search history.

(56) References Cited

U.S. PATENT DOCUMENTS 3,684,463 A * 8/1972 Koelbl .................... C22C 29/02
148/421
4,252,862 A * 2/1981 Nishida .................. C23C 28/321
428/698

(Continued)

FOREIGN PATENT DOCUMENTS

| JP | 62-167890 | * | 7/1987 |
| JP | 4900617 B2 | | 3/2012 |
| KR | 10-2014-0097687 A | | 8/2014 |

OTHER PUBLICATIONS

Du et al "The microstructure and mechanical propertites of ZrAlN/Cu coating" Trans Tech Publications 2011.*

(Continued)

*Primary Examiner* — Archene A Turner
(74) *Attorney, Agent, or Firm* — Staas & Halsey LLP

(57) ABSTRACT

An amorphous and nano nitride composite thin film, a method for forming the same, and an electronic device having the same are provided. The amorphous and nano nitride composite thin film has a composite structure in which a nitride phase that includes Zr and Al as nitride constituent elements and at least one metal phase are mixed, wherein the metal phase includes at least one element selected from the group including Cu and Ni, the nitride phase includes a ZrN crystalline phase in which a size of a grain is in the range of 10 nm to 500 nm, and a volume fraction of the ZrN crystalline phase is 10% or more.

6 Claims, 15 Drawing Sheets
(3 of 15 Drawing Sheet(s) Filed in Color)

(56) References Cited

U.S. PATENT DOCUMENTS

| | | | | |
|---|---|---|---|---|
| 5,338,374 | A | * | 8/1994 | Marcus ................. C22C 1/1084 |
| | | | | 75/357 |
| 5,409,782 | A | * | 4/1995 | Murayama .......... C23C 14/0015 |
| | | | | 428/457 |
| 8,029,917 | B2 | * | 10/2011 | Spain .................. A61F 2/30767 |
| | | | | 428/212 |
| 2004/0131894 | A1 | * | 7/2004 | Erdemir .............. C23C 14/0688 |
| | | | | 428/698 |
| 2004/0231460 | A1 | * | 11/2004 | Chun ..................... B04C 5/085 |
| | | | | 75/244 |
| 2012/0189866 | A1 | | 7/2012 | Chu et al. |

OTHER PUBLICATIONS

Musil et al "Hard and superhard Zr—Ni—N nanocomosite films" Surf & Coat Tech 139 (2001) p. 101-109.*

Musil et al "ZrN/Cu nanocomposite film—a novel superhard material" Surf & Coat Tech 120-121 (1999) p. 179-183.*

Musil et al "Strucuture and microhardness of magnetron sputtered zrCu and ZrCu—N films" Vacuum (1999) p. 269-275.*

\* cited by examiner

AMORPHOUS AND NANO NITRIDE COMPOSITE THIN FILM, METHOD FOR FORMING THE SAME, AND ELECTRONIC DEVICE HAVING THE SAME

CROSS-REFERENCE TO RELATED APPLICATIONS

This application is related to, and claims priority benefit under 35 U.S.C. § 119(a) to, Korean Patent Application No. 10-2015-0012890 filed on Jan. 27, 2015 in the Korean Intellectual Property Office, the disclosure of which is incorporated herein by reference.

BACKGROUND

1. Field

The present disclosure relates to an amorphous and nano nitride composite thin film, a method for forming the same, and an electronic device having the same, and more particularly to an amorphous and nano nitride composite thin film in which a size of a crystal grain that is formed by reactive sputtering is equal to or smaller than 500 nm, a method for forming the same, and an electronic device having the same.

2. Description of the Related Art

In general, in order to implement complicated shapes of electronic products, external cases of the electronic products have been manufactured using a die casting process. Since surfaces of such external cases are very weak against corrosion and have low strength, thin films are formed on the surfaces. In a process of forming a thin film, particularly in the case of depositing a thin film made of chrome or other metals through a physical vapor deposition (hereinafter referred to as "PVD"), a columnar structure may be formed in the deposited thin film due to the physical characteristic of a deposition condition. In this case, corrosion of the thin film may be accelerated since it is possible that a corrosive solution percolates along a grain boundary in the columnar structure. That is, the grain boundary in the columnar structure may be used as a path that accelerates the corrosion of the thin film.

Since the thin film that is formed with the columnar structure is very weak against the corrosion and has low strength, a layer that is printed or coated on an upper portion of the thin film may easily peel off.

Further, in the case where the thin film made of chrome or other metals is formed in a communication electronic device, such as a portable terminal, the thin film may shield electromagnetic waves.

SUMMARY

Additional aspects and/or advantages will be set forth in part in the description which follows and, in part, will be apparent from the description, or may be learned by practice of the invention.

An exemplary embodiment of the present invention may address at least the above needs and provide at least the advantages disclosed herein. An aspect of the present disclosure provides an amorphous and nano nitride composite thin film that has a high surface hardness and superior anti-corrosion properties and transmits electromagnetic waves, a method for forming the same, and an electronic device having the same.

According to an aspect of the present disclosure, an amorphous and nano nitride composite thin film has a composite structure in which a nitride phase that includes Zr and Al as nitride constituent elements and at least one metal phase are mixed, wherein the metal phase includes at least one element selected from the group including Cu and Ni, the nitride phase includes a ZrN crystalline phase in which a size of a grain is in the range of 10 nm to 500 nm, and a volume fraction of the ZrN crystalline phase is 10% or more.

The volume fraction of the ZrN crystalline phase may be in the range of 10% to 62.5%.

The volume fraction of the ZrN crystalline phase may be in the range of 25% to 40%.

The volume fraction of the ZrN crystalline phase may be in the range of 50% to 62.5%.

The volume fraction of the ZrN crystalline phase may be 25% or more.

The metal phase may further include at least one element selected from the group including Cr, Mo, Si, Nb, Co, Sn, In, Bi, Zn, V, Hf, Ag, Ti, and Fe.

According to an aspect of the present disclosure, a method for forming a composite thin film includes charging a chamber that is provided with a Zr-based alloy target having glass forming ability with an object to be treated, providing a reaction gas including $N_2$ and Ar into the chamber; and forming an amorphous and nano nitride composite thin film on at least one surface of the object to be treated by sputtering the Zr-based alloy target, wherein a ratio of the reaction gas N2 to the Ar is equal to or higher than 0.5.

The ratio of the reaction gas $N_2$ to the Ar may be 0.5 to 3.

The ratio of the reaction gas $N_2$ to the Ar may be 0.7 to 1.4.

The ratio of the reaction gas $N_2$ to the Ar may be 2 to 3.

The ratio of the reaction gas $N_2$ to the Ar may be equal to or higher than 0.7.

The Zr-based alloy target may be a crystalline alloy that is composed of Zr—Al—X, wherein X includes any one of Cu and Ni.

The Zr-based alloy target may have grains of which an average size is in the range of 0.1 µm to 5 µm.

The Zr-based alloy target may be a crystalline alloy that is composed of Zr—Al—X—Y, wherein Y is at least one element selected from the group including Cr, Mo, Si, Nb, Co, Sn, In, Bi, Zn, V, Hf, Ag, Ti, and Fe.

According to an aspect of the present disclosure, an electronic device includes the above-described object to be treated.

The object to be treated may be a body of the electronic device, and the composite thin film may be formed on an outer surface of the body.

BRIEF DESCRIPTION OF THE DRAWINGS

The patent or application file contains at least one drawing executed in color. Copies of this patent or patent application publication with color drawings will be provided by the Office upon request and payment of the necessary fee. The above and other aspects, features and advantages of the present disclosure will be more apparent from the following detailed description when taken in conjunction with the accompanying drawings.

DETAILED DESCRIPTION

Figure 1:
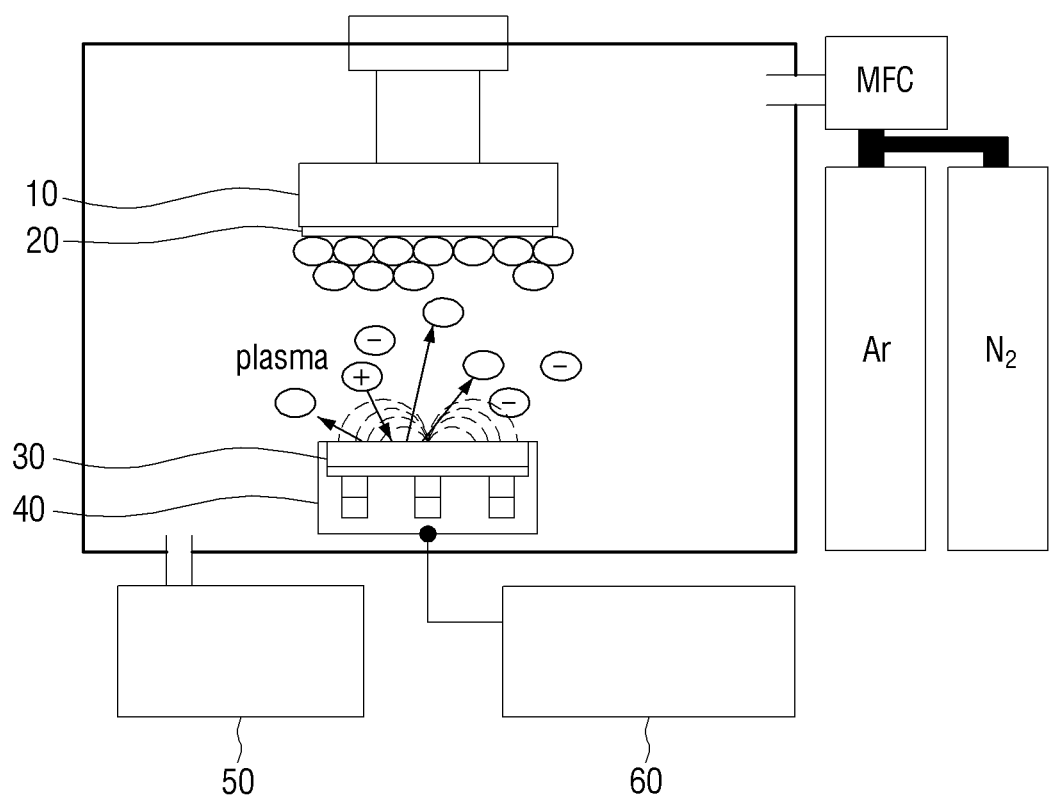
FIG. 1 is a schematic view illustrating a sputtering device to perform a process of forming an amorphous and nano nitride composite thin film according to an embodiment of the present disclosure.

Reference will now be made in detail to the embodiments, examples of which are illustrated in the accompanying drawings, wherein like reference numerals refer to the like elements throughout. The embodiments are described below to explain the present invention by referring to the figures.

The aspects and features of the present disclosure and methods for achieving the aspects and features will be apparent by referring to the embodiments to be described in detail with reference to the accompanying drawings. However, the present disclosure is not limited to the embodiments disclosed hereinafter, but can be implemented in diverse forms. It should be understood that all modifications, equivalents, or substitutes are included in the scope of the present disclosure.

A method for forming an amorphous and nano nitride composite thin film according to an embodiment of the present disclosure is described in detail with reference to the accompanying drawings.

The amorphous and nano nitride composite thin film according to an embodiment of the present disclosure may be formed by a deposition process through reactive sputtering using a crystalline alloy target.

An amorphous alloy may be defined as a solid body that has a grain size equal to or smaller than 1 nm and does not have a specific lattice periodicity of crystals. An amorphous alloy does not have a long-range order that is a characteristic of a crystalline alloy, but may have a somewhat short-range order in an atomic length scale due to the property of a chemical bond. The terms "order" and "disorder" are used as to indicate an existence and nonexistence of a certain symmetric or correlative relationship in a many-particle system, and the terms "long-range order" and "short-range order" are used to discriminate orders in a material based on the length scale. The amorphous alloy and the crystalline alloy may be discriminated from each other, for example, according to X-ray diffraction and lattice periodicity that may be determined by a structural characterization technology, such as a transmission electron microscopy. A nano crystalline alloy may be defined as having a grain size of 10 nm to 500 nm, and having a similar property to the amorphous alloy. A coated layer may be a thin film a having uniform thickness even in the case of depositing thin films having thin thickness of several tens of nanometers, and have strong anti-corrosion and scratch-resistance, and particularly, increased mechanical properties.

FIG. 1 is a schematic view illustrating a sputtering device to perform a process of forming an amorphous and nano nitride composite thin film according to an embodiment of the present disclosure.

Referring to FIG. 1, a sputtering process may be defined as a technology that forms a thin film on a surface of object to be treated. For example, a thin film may be formed on the surface of an object 20 to be treated by making Ar collide at high speed with a target 30 to which a negative voltage is applied by a gun 40 that receives a supply of a power from a power supply 60 in a chamber in which a vacuum pump 50 is operated and supplying atoms which secede from a crystalline alloy target 30 to the object to be treated 20 on an object holder 10. Such a sputtering process may be used in the semiconductor manufacturing and in surface processing of various kinds of members.

The object 20 to be treated may be a material that may be damaged by corrosion on its surface when it is put in a corrosive environment, and may be a metal material that includes a commercial non-ferrous metal, for example, such as Fe, Al, or Mg, or a non-metal material. The object 20 to be treated may be in a plate shape that is used to manufacture a general structure, but is not limited thereto. As an example, the object 20 to be treated may include a steel plate that is made of carbon steel or a stainless steel plate. As an example, the object 20 to be treated may be a component that operates in an environment in which corrosion occurs easily, such as a humid atmosphere, seawater, or an acidic or an alkaline atmosphere. As an example, the object 20 to be treated may be stainless steel that is used as a bipolar plate of a polymer electrolyte membrane fuel cell (PEMFC).

The crystalline alloy target 30 may be an alloy that is formed of three or more elements having glass-forming ability.

The glass-forming ability may be defined as a relative measure, representing whether an alloy having a specific composition may easily become amorphous up to a certain degree of a cooling rate. To form an amorphous alloy by casting, a high cooling rate of a predetermined level or more may be necessary, and in the case where a casting method with a relative slow cooling rate (e.g., copper mold casting method) is used, a glass-forming composition range may be reduced. In contrast, since a rapid solidification method, such as melt spinning in which a molten alloy is dropped on a rotating copper roll to solidify the molten alloy, for example, as a ribbon or wire, may obtain a maximized cooling rate of $10^4$ K/sec to $10^6$ K/sec or more, the glass-forming composition range may be increased. Accordingly, an evaluation of whether a specific composition has a certain degree of glass-forming ability may generally result in a relative value according to a cooling rate of a rapid cooling process used.

A glass-forming ability may depend on an alloy composition and a cooling rate. Since the cooling rate may be inversely proportional to a casting thickness [cooling rate ∝ (casting thickness)$^{-2}$], the glass-forming ability may be relatively quantified by evaluating a critical thickness of a cast in which an amorphous phase may be obtained during casting. For example, when using the copper mold casting method, the glass-forming ability may be expressed by a critical casting thickness (diameter with respect to a rod) of a cast in which an amorphous structure may be obtained. As an example, when forming a ribbon by melt spinning, the glass-forming ability may be expressed by a critical thickness of the ribbon in which the amorphous phase is formed.

According to an exemplary embodiment, an alloy having glass-forming ability denotes an alloy in which an amorphous ribbon having a casting thickness of 20 μm to 100 μm may be obtained when a melt of the alloy is cast at a cooling rate of $10^4$ K/sec to $10^6$ K/sec.

The crystalline alloy target according to an embodiment of the present disclosure may be a Zr-based target. For example, the alloy may be a ternary alloy formed of Zr, Al, and Cu (Zr—Al—Cu alloy), a ternary alloy formed of Zr, Al, and Ni (Zr—Al—Ni alloy), or a quaternary alloy formed of Zr, Al, Cu, and Ni (Zr—Al—Cu—Ni alloy). Hereinafter, the above-described ternary or quaternary alloy system is referred to as a "Zr—Al—X" alloy (where, X denotes any one or more elements selected from Cu and Ni). If it is assumed that the total sum of Zr, Al, and X is 100 at %, the alloy may include 5 at % to 20 at % of Al, 15 at % to 40 at % of X (sum of any one or more selected from Cu and Ni), and the remainder being Zr.

As an example, the crystalline alloy may be an alloy in which any one or more elements selected from the group consisting of Cr, Mo, Si, Nb, Co, Sn, In, Bi, Zn, V, Hf, Ag, Ti, and Fe are included in the above-described Zr—Al—X alloy, and is be referred to as a "Zr—Al—X—Y" alloy (where, Y denotes any one or more elements selected from the group consisting of Cr, Mo, Si, Nb, Co, Sn, In, Bi, Zn, V, Hf, Ag, Ti, and Fe). If it is assumed that the total sum of Zr, Al, X, and Y is 100 at %, the alloy may include not less than 5 at % but less than 20 at % of Al, 15 at % to 40 at % of X (sum of Cu and Ni), 8 at % or less (greater than 0) of Y (i.e., sum of any one or more elements selected from the group including Cr, Mo, Si, Nb, Co, Sn, In, Bi, Zn, V, Hf, Ag, Ti, and Fe), and the remainder being Zr.

The crystalline alloy target that is used to manufacture the amorphous and nano nitride composite thin film according to an embodiment of the present disclosure may be realized by appropriately heating an amorphous alloy or a nanocrystalline alloy, which includes three or more metallic elements and has the glass-forming ability as described above. The amorphous alloy may not substantially have a specific crystal structure, does not exhibit a resolvable sharp peak at a specific Bragg angle in an X-ray diffraction pattern, and exhibits a broad peak that can be observed in a wide angle range.

During a heating process, the amorphous alloy may be subjected to successive crystallization and grain growth processes to become a crystalline alloy. In a case of the nanocrystalline alloy, it may become the crystalline alloy through the grain growth in the heating process. In this case, the heating of the amorphous alloy or the nanocrystalline alloy may be performed in a temperature range which is not less than a crystallization initiation temperature and is less than a melting temperature of the amorphous alloy or the nanocrystalline alloy. The heating conditions in the above-described temperature range, for example, the heating time, may be appropriately controlled to obtain an average grain size of the alloy target that is equal to or smaller than 5 μm, for example, in the range of 0.1 μm to 5 μm, strictly, in the range of 0.1 μm to 1 μm, more strictly, in the range of 0.1 μm to 0.5 μm, and much more strictly, in the range of 0.3 μm to 0.5 μm.

The crystalline alloy manufactured through the above-described process may be used as a target for sputtering as it is, or may be manufactured as a purposed target for sputtering by changing the shape or dimension of the alloy through an appropriate process.

According to an embodiment of the present disclosure, the crystallization initiation time may be defined as a temperature at which an alloy that is in an amorphous state begins to be crystallized, and has an inherent value according to a specific alloy composition. Accordingly, the crystallization initiation temperature of the nanocrystalline alloy may be defined as the temperature at which crystallization of the amorphous alloy having the same composition as the nanocrystalline alloy begins.

The crystalline alloy target according to the present disclosure has very superior thermal stability in comparison to an amorphous alloy having the same composition. That is, in the case of the amorphous alloy, nanocrystals are locally formed while partial crystallization locally occurs due to thermal instability caused by thermal energy transferred from an outside. Such localized crystallization may be weakened due to a structural relaxation phenomenon of the amorphous alloy and fracture toughness may be reduced. Accordingly, the target is liable to be damaged or destroyed during sputtering.

However, the grain size of the crystalline alloy that is used in the present disclosure may be controlled by crystallization or grain growth of an amorphous alloy or nanocrystalline alloy. The crystalline alloy according to the present disclosure does not exhibit large changes in microstructure even if heat is applied from the outside. Accordingly, resistance to fracture that is due to thermal and mechanical instabilities is improved compared to a conventional amorphous alloy.

In the case of a sputtering target, ions accelerated from plasma during a sputtering process continuously collide with the sputtering target, and accordingly, the temperature of the sputtering target inevitably increases during the sputtering process. In the case where the sputtering target is composed of an amorphous alloy, localized crystallization on the target surface according to the temperature rise may proceed during the sputtering process, and the localized crystallization may increase brittleness of the target to facilitate the fracture of the target during the sputtering process.

In contrast, since the crystalline alloy that is used as the target according to the present disclosure may have a microstructure in which grains having a specific size range controlled by a heat treatment are uniformly distributed, thermal/mechanical stability is significantly improved. Thus, changes in the localized structure do not occur even due to the temperature rise of the target that occurs during the sputtering and thus the mechanical instability as described above does not occur. Accordingly, the crystallization alloy target according to the present disclosure may be used in stably forming the amorphous and nano nitride composite thin film by using sputtering.

A method for manufacturing an alloy target for sputtering using a crystalline alloy is exemplarily described.

The alloy for sputtering that is composed of a crystalline apply according to the present disclosure may be formed by casting the above-described amorphous alloy or nanocrystalline alloy in a similar size and shape to those of a sputtering target actually used. Crystallization or grain growth of the cast amorphous alloy or nanocrystalline alloy may be performed by a heat treatment, e.g., annealing, to manufacture a crystalline alloy target.

According to an exemplary method a plurality of amorphous alloys or nanocrystalline alloys are prepared and the plurality of amorphous alloys or nanocrystalline alloys are heat-pressurized to be bonded to each other to manufacture a sputtering target. Plastic deformation of the amorphous alloy or the nanocrystalline alloy may occur during the heat-pressurizing.

The annealing treatment or heat pressurization may be performed in a temperature range of a crystallization initiation temperature of the amorphous alloy or nanocrystalline alloy or more to less than a melting temperature thereof. The crystallization initiation temperature is defined as a temperature at which phase transition of an alloy having a specific composition from an amorphous state to a crystalline state begins.

The amorphous alloys or the nanocrystalline alloys that are prepared in plurality may be, for example, amorphous alloy powder or nanocrystalline alloy powder. Aggregates of these alloy powders may be bonded together by pressure-sintering the aggregates in a sintering mold to be manufactured in a shape and a size similar to those of an actual target. In this case, the pressure-sintering may be performed in a temperature range of a crystallization initiation temperature of a composition of the alloy powder or more to less than a melting temperature thereof. Crystallization and/or grain growth may occur while the aggregates of the amorphous alloy powder or the aggregates of the nanocrystalline alloy powder are bonded together by interdiffusion during the heating process. In this case, time and/or temperature of the crystallization or grain growth may be controlled to obtain grains having a specific size range. Accordingly, the grain size of the alloy having crystallization or grain growth finally completed may be equal to or smaller than 5 μm, for example, in the range of 0.1 μm to 5 μm, strictly, in the range of 0.1 μm to 1 μm, more strictly, in the range of 0.1 μm to 0.5 μm, and much more strictly, in the range of 0.3 μm to 0.5 μm.

The amorphous alloy powder or the nanocrystalline alloy powder may be prepared by atomizing. A melt may be prepared in which the above-described elements having glass-forming ability are melted. The alloy powder is formed by rapidly cooling the melt through spraying of inert gas, such as argon gas, on the melt while atomizing the melt.

As an example, the amorphous alloys or nanocrystalline alloys that are prepared in plurality may be an amorphous alloy ribbon or a nanocrystalline alloy ribbon. The plurality of ribbons may be stacked, and then a target may be formed by heat-pressurizing the ribbons in a temperature range of a crystallization initiation temperature of a composition of the alloy ribbons or more to less than a melting temperature thereof. Crystallization and/or grain growth may occur while the amorphous alloy ribbon stack or the nanocrystalline alloy ribbon stack is bonded together by interdiffusion between the ribbons during the heat-pressurizing process.

An interface between the stacked alloy ribbons generated during the above process may be annihilated by interdiffusion.

The amorphous alloy ribbon or the nanocrystalline alloy ribbon may be prepared by a rapid solidification process such as melt spinning. Specifically, a melt may be prepared in which the above-described elements having glass-forming ability are melted, and an amorphous alloy or nanocrystalline alloy in a ribbon shape may be prepared by putting the melt onto the surface of a roll that is rotated at a high speed and rapidly solidifying the melt.

As an example, the amorphous alloys or nanocrystalline alloys that are prepared in plurality may be amorphous alloy casts or nanocrystalline alloy casts. The amorphous alloy cast or the nanocrystalline alloy cast may have a rod or plate shape. Crystallization and/or grain growth may occur while a stack having the plurality of amorphous alloy casts or a stack having the plurality of nanocrystalline alloy casts is bonded by interdiffusion between individual alloy casts during the heat-pressurizing process. An interface between the alloy casts may be annihilated by interdiffusion.

The amorphous alloy cast or the nanocrystalline alloy cast may be prepared by using a suction method or pressurizing method, in which the melt is introduced into the inside of a mold formed of copper having high cooling ability using a pressure difference between the inside and outside of the mold. For example, when using a copper mold casting method, a melt is prepared in which the above-described elements having glass-forming ability are melted, and an amorphous alloy cast or nanocrystalline alloy cast having a predetermined shape may be prepared by injecting the melt into a copper mold at a high speed through a nozzle through pressurizing or suctioning the melt and rapidly solidifying the melt.

Even in the case of the alloy ribbon or the alloy cast, in the same manner as the alloy powder, the grain size of the finally crystallized alloy may be controlled to be in the above-described range.

On the other hand, the amorphous and nano nitride composite thin film according to an embodiment of the present disclosure may be formed by sputtering using a crystalline alloy target.

As described above, the amorphous and nana nitride composite thin film according to an embodiment of the present disclosure may be referred to as a thin film which has fine grains that correspond to the grain size in the range of 10 nm to 500 nm and has a structure in which a metallic nitride phase and one or more metal phases are mixed. The metallic nitride phase may include Zr and Al as constituent elements of nitride, and the metal phase may include any one or more elements selected from Cu and Ni.

In this case, the amorphous and nano nitride composite thin film exhibits a crystal structure of Zr nitride, and other metal elements including Al may be solidified in the Zr nitride in the form of nitride. In this case, the Zr nitride includes ZrN. For example, in the case of Al, it may be solidified in ZrN by substituting for a part of a place of Zr that constitutes a ZrN crystal lattice. In this case, the nitride including Zr and Al may mean a solid solution of ZrN and AlN. In the amorphous and nano nitride composite thin film, the metallic nitride phase XrN may have a nanocrystalline structure that is composed of nano-level grains.

On the other hand, the metal phase may include a metal element having lower nitride-forming ability than a metal element constituting nitride. In the amorphous and nano nitride composite thin film, the metallic nitride phase may have a nanocrystalline structure that is composed of nano-level grains, whereas a very small amount of the metal phase may be distributed on such a nano grain boundary. For example, the metal phase may be distributed in the unit of several atoms thereof, and may exist in the form in which it does not have a special crystal structure. However, the metal phase may not concentrically distributed on a specific zone, but may be uniformly distributed on the whole thin film.

In the case of forming a thin film on a mother material by non-reactive sputtering using a crystalline alloy target, the thin film may be an amorphous alloy thin film. The non-reactive sputtering may be defined as sputtering that is performed with only an inert gas, for example, a gas such as Ar, without intentionally introducing a gas that is reactive to a material that forms the crystalline alloy target into a sputtering device. The crystalline alloy target has glass-forming ability, and thus exhibits an amorphous alloy structure in a process in which a solid phase is formed at high cooling speed, such as sputtering. The formed amorphous alloy thin film may have a composition that is similar to the composition of the crystalline alloy target used in the sputtering.

In the case of forming a thin film on a mother material by reactive sputtering using the crystalline alloy target, the thin film may have an amorphous and nano nitride composite thin film. For example, in the case of performing sputtering while introducing a nitrogen gas (N2) or a gas including nitrogen (N), for example, NH3 gas, to the inside of a sputtering chamber as a reaction gas, Zr, which has high reactivity with nitrogen in an alloy, may react on nitrogen to form Zr nitride, for example, ZrN or Zr2N, and other elements may be solidified in the Zr nitride or may exist as a metal phase. In this case, the manufactured thin film may have fine grains with a nano-level size, for example, in the range of 10 nm to 500 nm.

Figure 2:
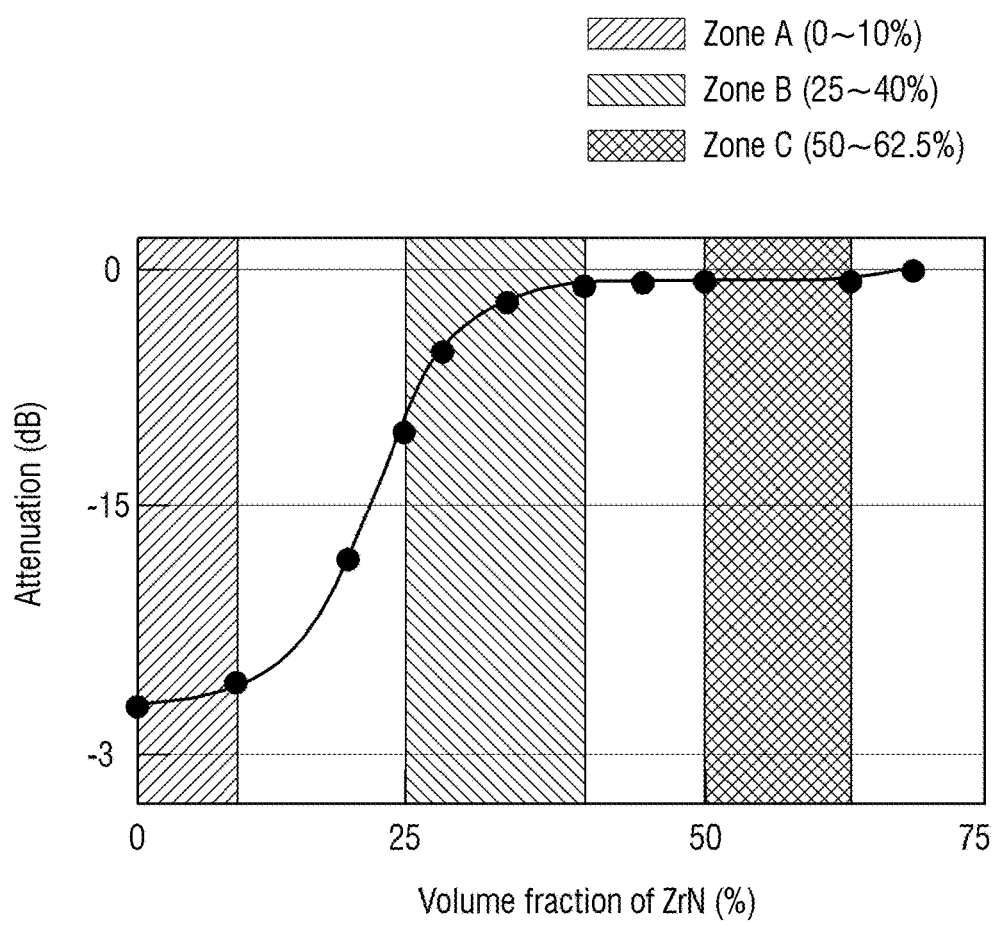
FIG. 2 is a graph illustrating a relationship between a volume fraction of a ZrN crystalline phase and electromagnetic wave attenuation of an amorphous and nano nitride composite thin film according to an embodiment of the present disclosure.

FIG. 2 is a graph illustrating the relationship between a volume fraction of a ZrN crystalline phase and electromagnetic wave attenuation of an amorphous and nano nitride composite thin film according to an embodiment of the present disclosure.

Table 1 illustrates an electromagnetic wave attenuation and color according to a change of a volume fraction of a ZrN crystalline phase of an amorphous and nano nitride composite thin film with a deposition thickness of 1 μm according to an embodiment of the present disclosure.

TABLE 1

| Point | Volume Fraction of ZrN (%) | Electromagnetic Wave Attenuation (dB) | Color | Remarks |
| --- | --- | --- | --- | --- |
| Point 1 | 0.0 | −27.94 | Silver | Amorphous |
| Point 2 | 10.0 | −26.05 | Silver | |
| Point 3 | 20.0 | −15.79 | Green | |
| Point 4 | 25.0 | −10 | Gold | |
| Point 5 | 30.0 | −1.54 | Gold | |
| Point 6 | 35.0 | −0.67 | Gold | Composite A |
| Point 7 | 40.0 | −0.66 | Gold | |
| Point 8 | 45.0 | −0.64 | purple | |
| Point 9 | 50.0 | −0.62 | Black | |
| Point 10 | 62.5 | −0.60 | Black | Composite B |
| Point 11 | 67.0 | −0.50 | Dark Blue | |

* Deposition Thickness: 1.0 μm

Referring to FIG. 2 and Table 1, in the case where a volume fraction of a ZrN crystalline phase of a deposited thin film, i.e., a volume ratio, is 0%, it can be confirmed that the deposited thin film is an amorphous alloy thin film that has a similar property to that of a general metal thin film, and the electromagnetic wave attenuation is −27.94 dB.

In the case where the deposited thin film is an amorphous and nano nitride composite thin film having a volume ratio of a ZrN crystalline phase that exceeds 0%, the electromagnetic wave attenuation of the amorphous and nano nitride composite thin film is increased as the volume ratio of the ZrN crystalline phase is increased. For example, it can be confirmed that an amorphous and nano nitride composite thin film A (composite A) and an amorphous and nano nitride composite thin film B (composite B) have electromagnetic wave attenuations of −0.67 dB and −0.60 dB, respectively. In particular, it can be confirmed that in a section in which the volume ratio of the ZrN crystalline phase is increased from 25.0% to 30.0%, the electromagnetic wave attenuation of the deposited thin film is abruptly increased from −10 dB to −1.54 dB. As the volume ratio of the ZrN crystalline phase of the deposited thin film is continuously increased to approach 100%, the deposited thin film has a property that is close to ceramic, and the electromagnetic wave attenuation approaches 0 dB.

If the electromagnetic wave transmission rate is equal to or higher than 10 dB, it may be considered that transmission of the electromagnetic waves becomes possible and thus the deposited thin film that is the amorphous and nano nitride composite thin film can transmit the electromagnetic waves in the range in which the volume ratio of the ZrN crystalline phase is equal to or higher than 25%.

Figure 3:
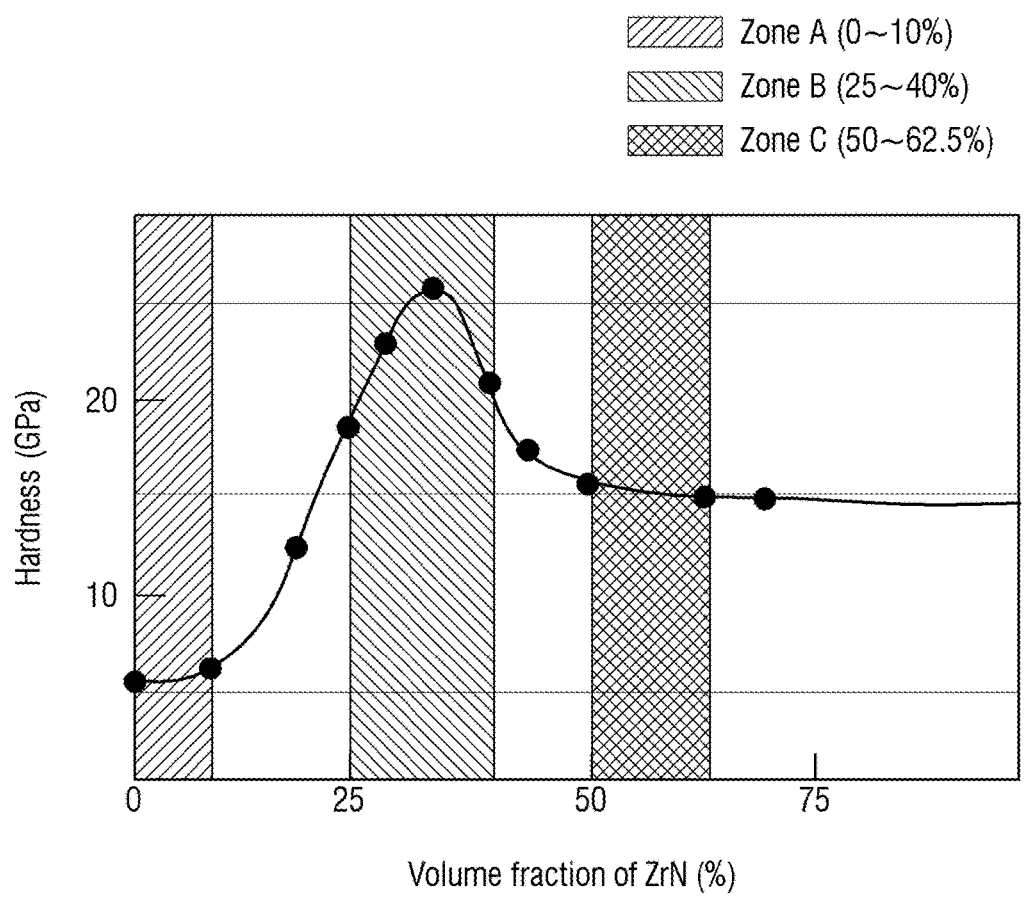
FIG. 3 is a graph illustrating a relationship between a volume fraction of a ZrN crystalline phase and hardness of an amorphous and nano nitride composite thin film according to an embodiment of the present disclosure.

FIG. 3 is a graph illustrating the relationship between a volume fraction of ZrN crystalline phase and hardness of an amorphous and nano nitride composite thin film according to an embodiment of the present disclosure.

Table 2 illustrates hardness, elastic modulus, and color according to a change of a volume fraction of a ZrN crystalline phase of an amorphous and nano nitride composite thin film with a deposition thickness of 1 μm according to an embodiment of the present disclosure.

TABLE 2

| Point | Volume Fraction of ZrN (%) | Hardness (GPa) | Elastic Modulus (GPa) | Color | Remarks |
| --- | --- | --- | --- | --- | --- |
| Point 1 | 0.0 | 6.0 | 106.9 | Silver | Amorphous |
| Point 2 | 10.0 | 6.9 | 129.9 | Silver | |
| Point 3 | 20.0 | 12.4 | 209.2 | Green | |
| Point 4 | 25.0 | 18.9 | 238.4 | Gold | |
| Point 5 | 30.0 | 23.1 | 261.3 | Gold | |
| Point 6 | 35.0 | 26.8 | 275.1 | Gold | Composite A |
| Point 7 | 40.0 | 21.0 | 250.5 | Gold | |
| Point 8 | 45.0 | 17.5 | 233.0 | purple | |
| Point 9 | 50.0 | 15.5 | 226.0 | Black | |
| Point 10 | 62.5 | 15.0 | 225.4 | Black | Composite B |
| Point 11 | 67.0 | 14.9 | 210.1 | Dark Blue | |

* Deposition Thickness: 1.0 μm

Referring to FIG. 3 and Table 2, if the ZrN crystalline phase has a specific volume fraction, the amorphous and nano nitride composite thin film may have high hardness. That is, ZrN that is Zr nitride having high hardness and a metal alloy having relatively low elastic coefficient are mixed in the thin film to achieve very fine grains with a nano-level size, and thus the thin film exhibits high hardness.

According to the amorphous and nano nitride composite thin film, the hardness becomes 10 GPa at point 2 at which the volume fraction of the ZrN crystalline phase is 10%, and the hardness is abruptly increased and becomes 12.4 GPa at point 3 at which the volume fraction of the ZrN crystalline phase is 20%. The hardness becomes highest at point 6 at which the volume fraction of the ZrN crystalline phase is 35%, and thereafter, the hardness of the amorphous and nano nitride composite thin film is abruptly decreased as the volume fraction of the ZrN crystalline phase is increased, resulting in that any further change of the hardness is not observed at point 10 at which the volume fraction of the ZrN crystalline phase is 32.5%. As a result, the amorphous and nano nitride composite thin film may have improved hardness in the case where the volume fraction of the ZrN crystalline phase is in the range of 10% to 62.5%.

Further, the amorphous and nano nitride composite thin film exhibits a general silver color in zone A in which the volume fraction of the ZrN crystalline phase is equal to or lower than 10%, whereas it exhibits a gold color in zone B that is measured from point 4 at which the volume fraction of the ZrN crystalline phase is 25% to point 7 at which the volume fraction of the ZrN crystalline phase is 40%. The amorphous and nano nitride composite thin film exhibits a black color in zone C that is measured from point 9 at which the volume fraction of the ZrN crystalline phase is 50% to point 10 at which the volume fraction of the ZrN crystalline phase is 62.5%. As a result, the amorphous and nano nitride composite thin film may have a gold color in the case where the volume fraction of the ZrN crystalline phase is in the range of 25% to 40%, while having a black color in the case where the volume fraction of the ZrN crystalline phase is in the range of 50% to 62.5%.

Figure 4:
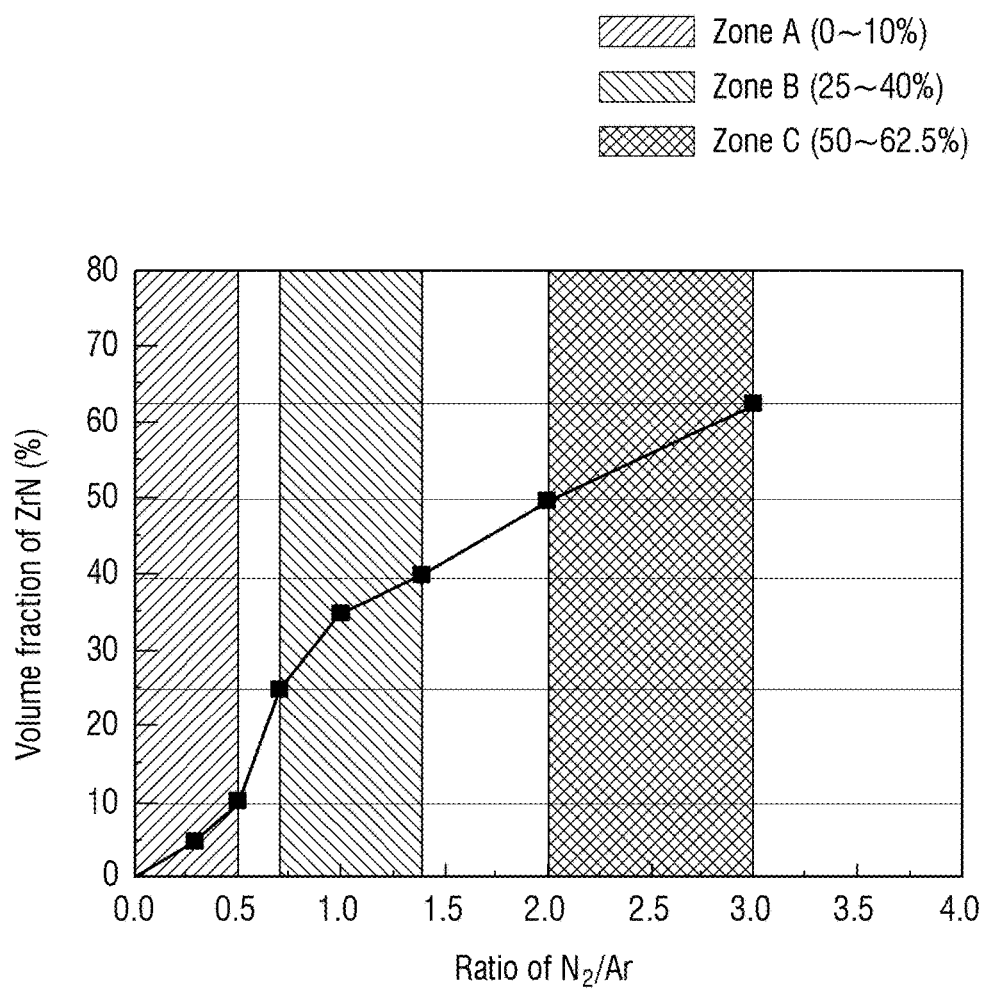
FIG. 4 is a graph illustrating a relationship between a volume fraction of a ZrN crystalline phase and a ratio of a reaction gas N2 to Ar of an amorphous and nano nitride composite thin film according to an embodiment of the present disclosure.

FIG. 4 is a graph illustrating the relationship between a volume fraction of a ZrN crystalline phase and a ratio of a reaction gas N2 to Ar of an amorphous and nano nitride composite thin film according to an embodiment of the present disclosure. Table 3 illustrates the ratio of the reaction gas N2 to Ar for the specific point shown in Table 2.

TABLE 3

| Point | $N_2$/Ar Ratio | Volume Fraction of ZrN (%) | Color |
|---|---|---|---|
| Point 1 | 0 | 0 | Silver |
| Point 2 | 0.5 | 10 | Silver |
| Point 4 | 0.7 | 25 | Gold |
| Point 6 | 1 | 35 | Gold |
| Point 7 | 1.4 | 40 | Gold |
| Point 9 | 2 | 50 | Black |
| Point 10 | 3 | 62.5 | Black |

Referring to FIG. 4, and Table 3, it can be confirmed that the amorphous and nano nitride composite thin film can transmit electromagnetic waves in the case where the ratio of the reaction gas $N_2$ to Ar is equal to or higher than 0.7, and can have high hardness in the case where the ratio of the reaction gas $N_2$ to Ar is in the range of 0.5 to 3. It can be confirmed that the amorphous and nano nitride composite thin film exhibits a gold color in the case where the ratio of the reaction gas N2 to Ar is in the range of 0.7 to 1.4, and exhibits a black color in the case where the ratio of the reaction gas $N_2$ to Ar is in the range of 2 to 3.

The volume ratio of the ZrN crystalline phase as shown in Table 3 may be acquired by connecting containers that contain the respective gases to the existing sputtering device and adjusting the amount of the reaction gas. MFCs (Mass Flow Controllers) may be installed in the mounted gas containers, and the amount of gas may be controlled after a chamber pressure of the reactive sputtering device is reduced to about 10-6 torr or less. In this case, the MFCs can calculate flow rates based on the masses of gases. Since elements that constitute the respective gases have different inherent masses, the MFCs that are set to match the respective gases may be separately installed in the respective containers. Unless the MFCs are separately installed in the respective containers as described above, mass values may be corrected to be used. Since the amount of the reaction gas should satisfy the stoichiometric ratio of the amorphous and nano nitride composite thin film, it should be precisely controlled.

For example, thin films having different stoichiometric ratios may be formed in accordance with the amount of N2 being injected. Accordingly, in order to satisfy the stoichiometric ratio, MFC devices that can precisely control even an amount of gas that is equal to or less than 0.1 sccm may be used. In this case, during sputtering of nitride, such as ZrN, a part of nitrogen may be lost. That is, once ZrN is separated into Zr and N due to collision with strong anions, N may not take part in the reaction again, but may be discharged to an outside through a vacuum pump. Further, even if N, which is in the form of N or $N_2$, reaches an object to be treated to be successfully deposited thereon, it may be re-evaporated again. Since such a partial loss of nitrogen exerts an influence on the characteristics of the thin film, $N_2$ may be additionally injected as much as the lost amount to satisfy the stoichiometric ratio.

Figure 5:
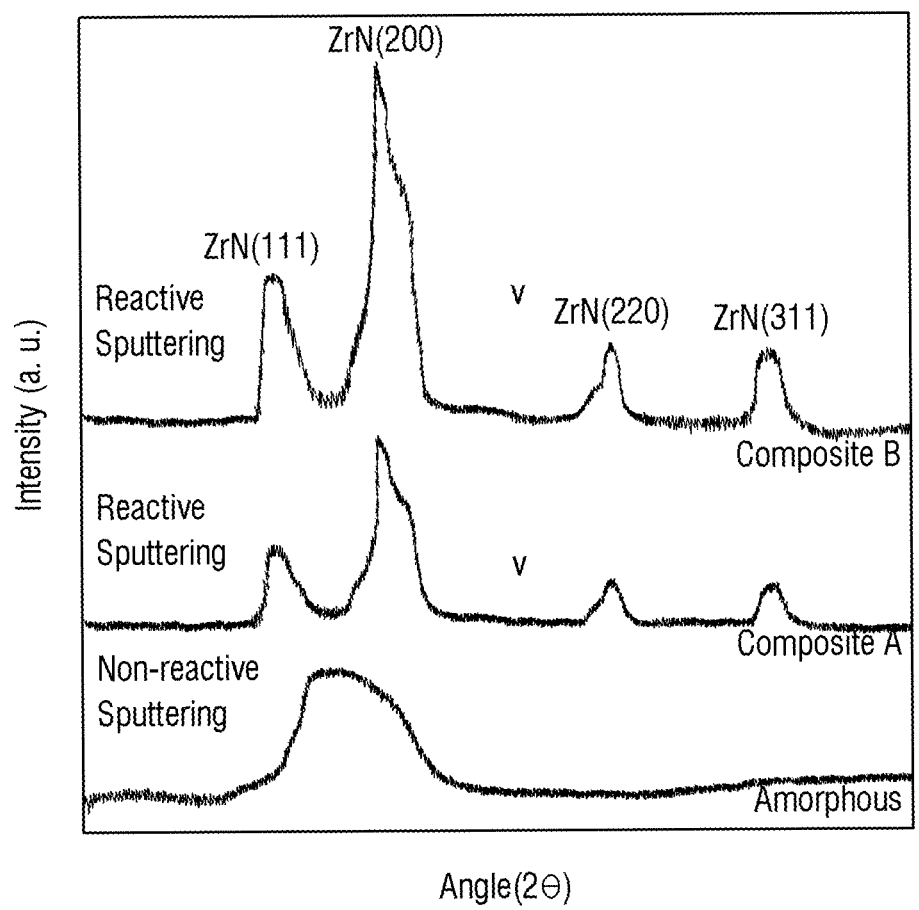
FIG. 5 is a graph illustrating X-ray diffraction patterns of an amorphous thin film, that is, an amorphous and nano nitride composite thin film according to an embodiment of the present disclosure.

FIG. 5 is a graph illustrating X-ray diffraction patterns of an amorphous thin film, that is, an amorphous and nano nitride composite thin film according to an embodiment of the present disclosure.

Referring to FIG. 5, the thin film that is deposited by non-reactive sputtering using Ar gas only has an amorphous structure. The feature of the non-reactive sputtering thin film is similar to the feature of the amorphous structure in a manner that the position (value of 2θ) of a diffuse Bragg peak is similar to the position of ribbon having the same composition. That is, the thin film that is manufactured by sputtering is an amorphous thin film, and the position of the Bragg peak exhibits almost the same value as that of the amorphous thin film having the corresponding composition. This indicates that the composition of the crystalline alloy has been substantially congruently transferred into the thin film through the non-reactive sputtering process.

Further, it may be confirmed that thin films that are deposited by reactive sputtering in Ar and $N_2$ mixing atmosphere, for example, an amorphous and nano nitride composite thin film A (composite A) in which the volume fraction of the ZrN crystalline phase is 35% and an amorphous and nano nitride composite thin film B (composite B) in which the volume fraction of the ZrN crystalline phase is 62.5%, have a crystalline structure. That is, a peak of Zr nitride that is formed by nitridation is observed. In this case, ZrN is observed as the Zr nitride.

Figure 6:
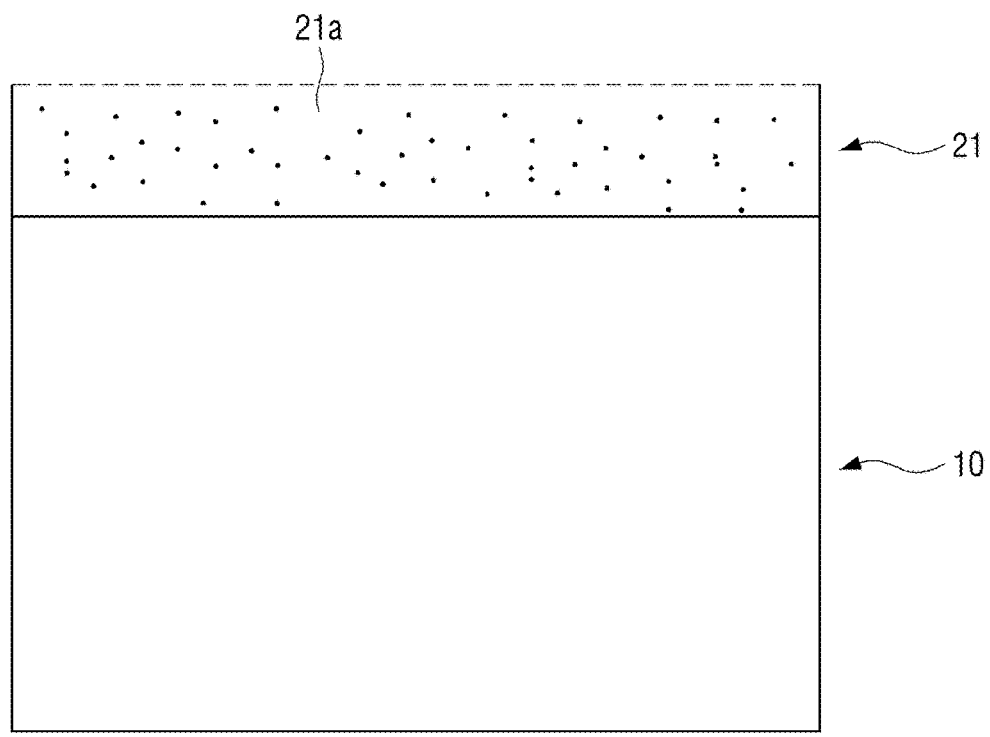
FIG. 6 is an enlarged cross-sectional view illustrating an exemplary fine structure of a part of an amorphous deposited thin film.

FIG. 6 is an enlarged cross-sectional view illustrating a fine structure of a part of an amorphous thin film deposited by non-reactive sputtering which is manufactured using Ar gas only.

Referring to FIG. 6, only an amorphous structure 21a is observed in a thin film 21 that is formed on the surface of an object 10 to be treated, but ZrN crystalline structure is not observed.

Figure 7:
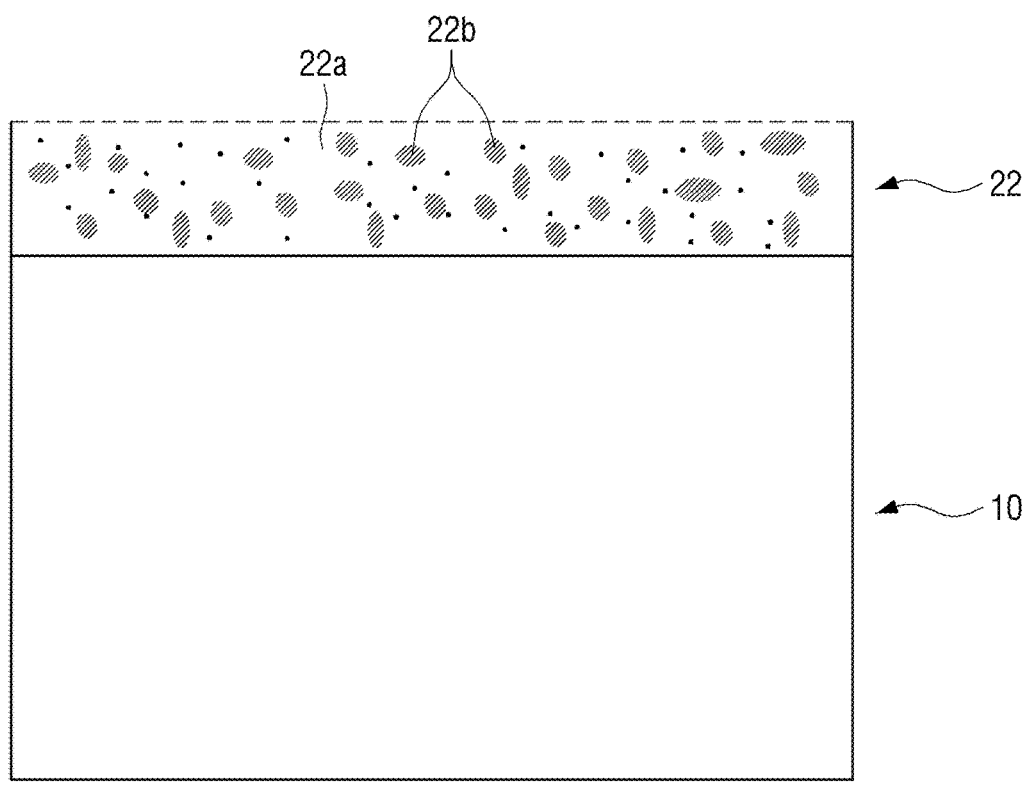
FIG. 7 is an enlarged cross-sectional view illustrating an exemplary fine structure of a part of an amorphous and nano nitride composite thin film that exhibits a gold color.
Figure 8:
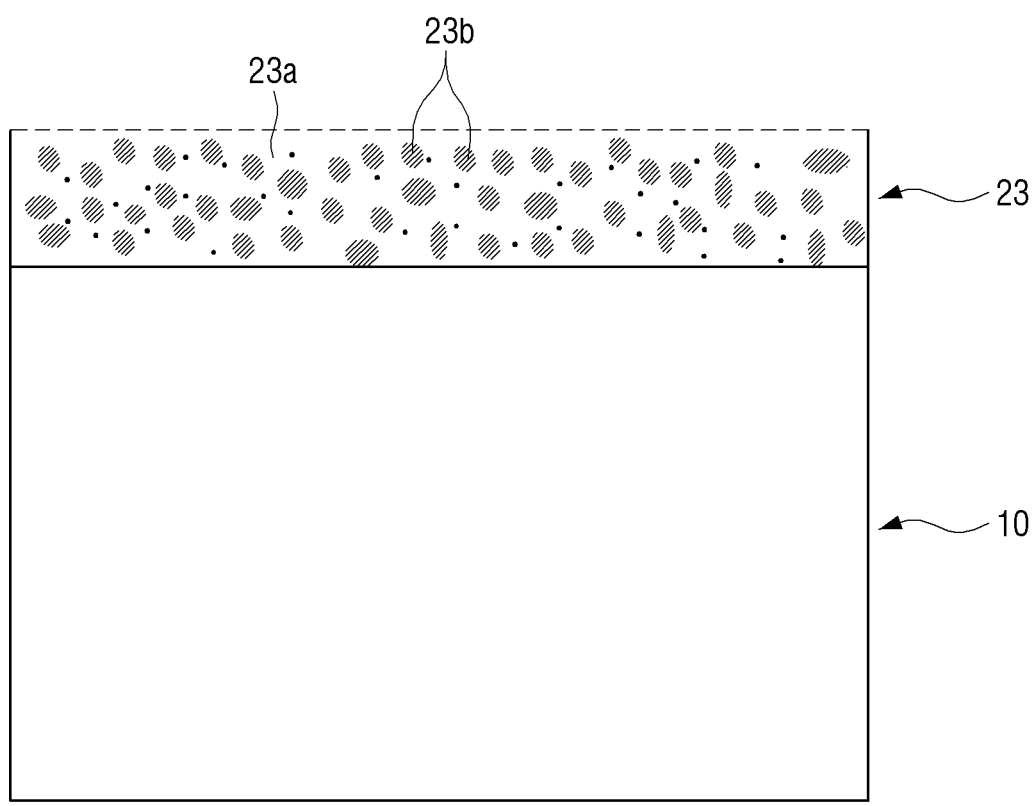
FIG. 8 is an enlarged cross-sectional view illustrating an exemplary fine structure of a part of an amorphous and nano nitride composite thin film that exhibits a black color.

FIG. 7 is an enlarged cross-sectional view illustrating a fine structure of a part of an amorphous and nano nitride composite thin film which is deposited by reactive sputtering in Ar and $N_2$ mixing atmosphere to exhibit a gold color, and FIG. 8 is an enlarged cross-sectional view illustrating a fine structure of a part of an amorphous and nano nitride composite thin film which is deposited by reactive sputtering in Ar and $N_2$ mixing atmosphere to exhibit a black color.

Referring to FIG. 7, a crystalline structure of an amorphous and nano nitride composite thin film A (composite A), in which the volume fraction of the ZrN crystalline phase as described above is 35%, may be confirmed. A ZrN crystalline structure 22b is positioned in an amorphous structure 22a of a thin film 22 that is formed on the surface of an object 10 to be treated.

Referring to FIG. 8, a crystalline structure of an amorphous and nano nitride composite thin film B (composite B), in which the volume fraction of the ZrN crystalline phase as described above is 62.5%, may be confirmed. A ZrN crystalline structure 23b is positioned in an amorphous structure 23a of a thin film 23 that is formed on the surface of an object 10 to be treated.

In this case, it can be confirmed that the amorphous and nano nitride composite thin film B has ZrN crystalline structures 23b of which the number is larger than that of the amorphous and nano nitride composite thin film A. The ZrN crystalline structure has higher hardness than that of the amorphous structure, and exhibits a certain color. Accordingly, the amorphous and nano nitride composite thin film B has higher hardness that of the amorphous and nano nitride composite thin film A and has a dark color. Referring to Tables 1 and 2, it can be confirmed that the amorphous and nano nitride composite thin film A has a gold color, and the amorphous and nano nitride composite thin film A having an increased ZrN crystalline structure has a black color.

FIG. 9A to 9D illustrate a comparison of electromagnetic wave attenuations among devices on which a Cr thin film, an amorphous thin film, and an amorphous and nano nitride composite thin film according to an embodiment of the present disclosure are formed, respectively.

Figure 9A:
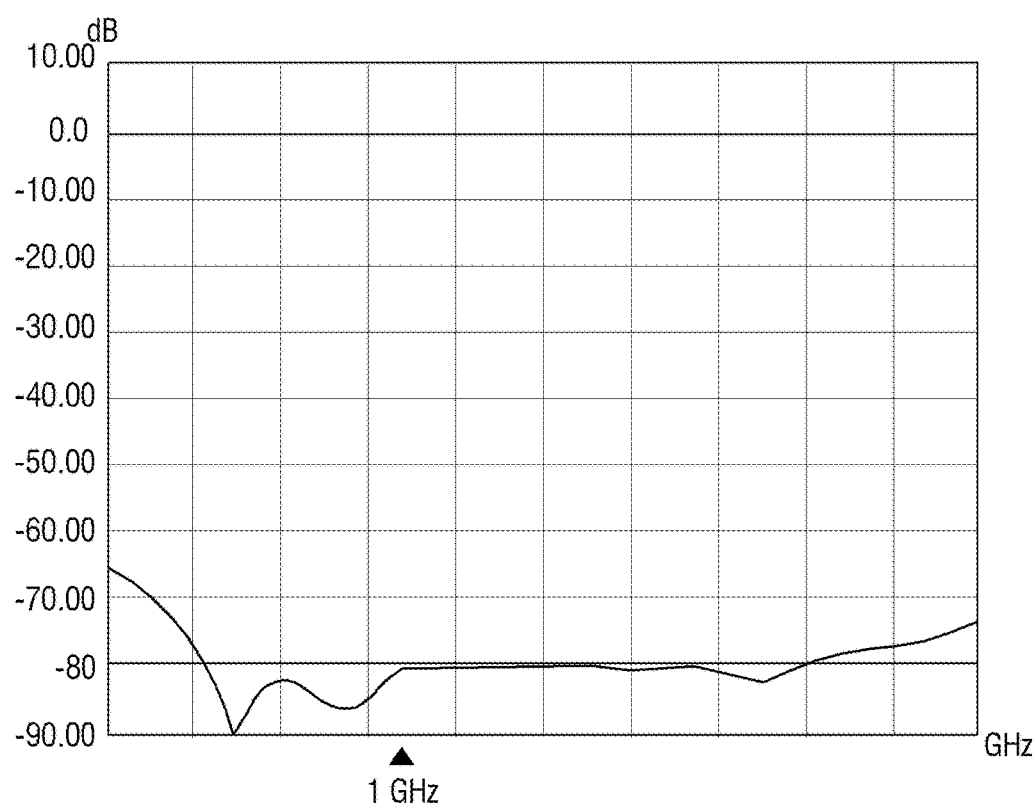
FIG. 9A to 9D are diagrams illustrating a comparison of electromagnetic wave attenuations among devices on which a Cr thin film, an amorphous thin film, and an amorphous and nano nitride composite thin film according to an embodiment of the present disclosure are formed, respectively.

As illustrated in FIG. 9A, a thin film with a thickness of 1 μm, which is formed by depositing Cr, has electromagnetic wave attenuation of a portable terminal of −80 dB in a quite wide bandwidth including a frequency of 1 GHz.

Figure 9B:
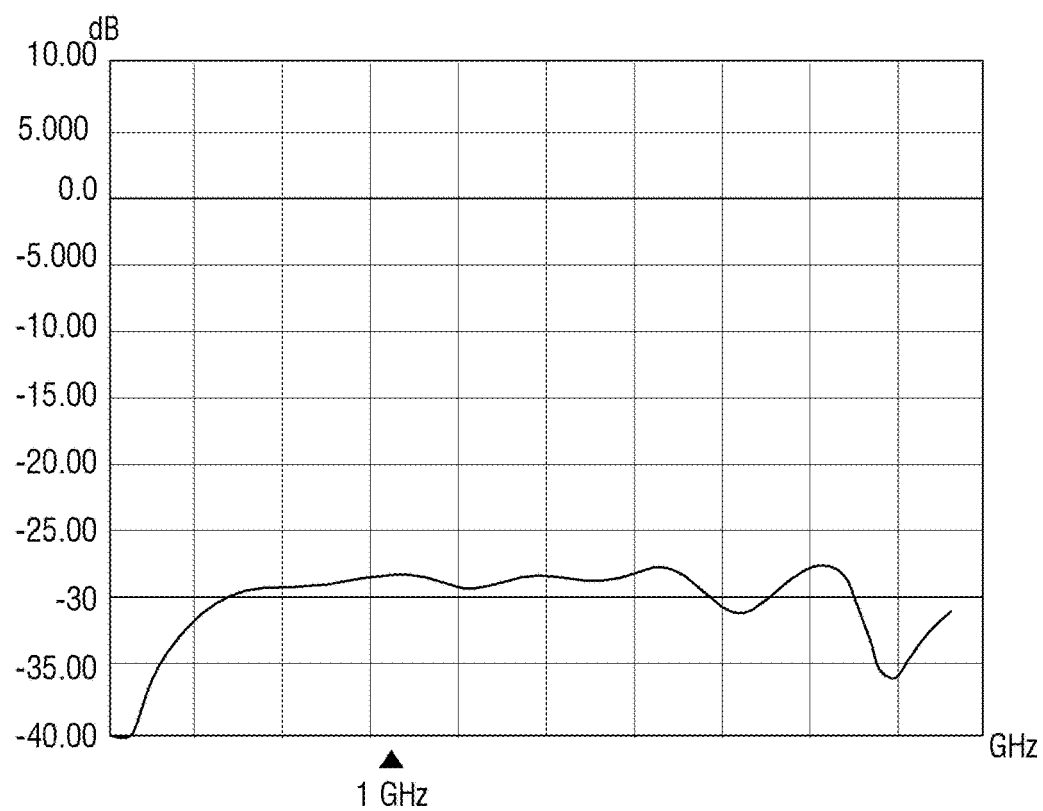

As illustrated in FIG. 9B, an amorphous thin film that is formed with a thickness of 1 μm has electromagnetic wave attenuation of a portable terminal of −30 dB in a wide bandwidth including a frequency of 1 GHz.

Figure 9C:
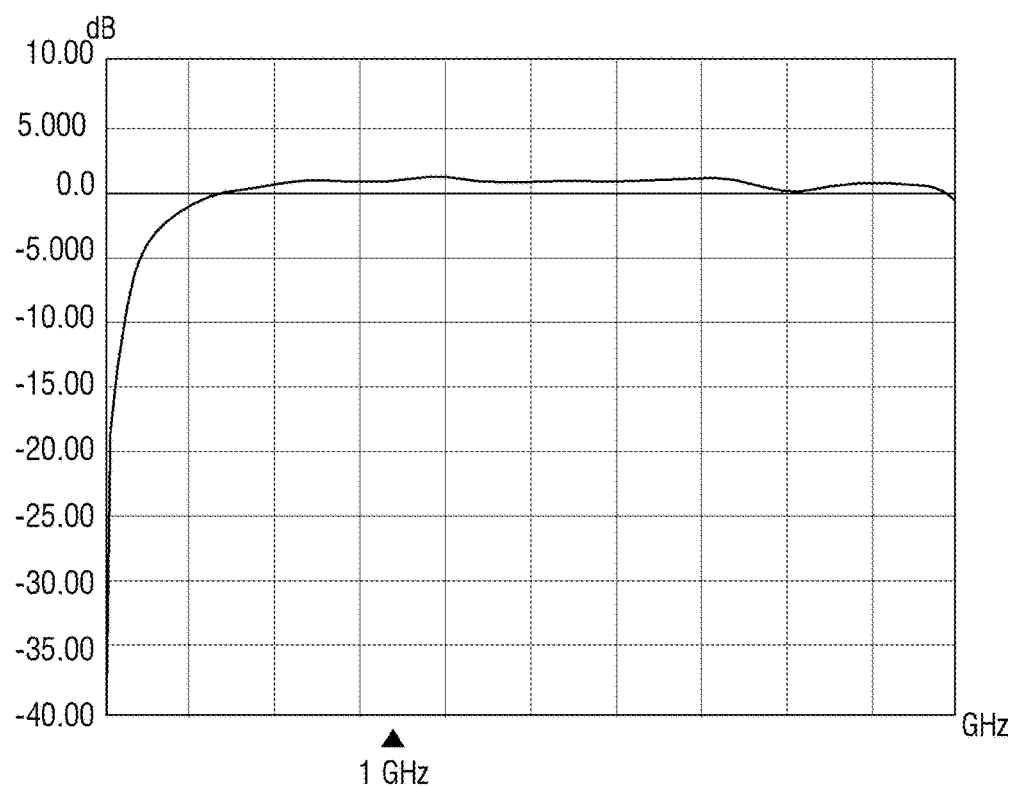
Figure 9D:
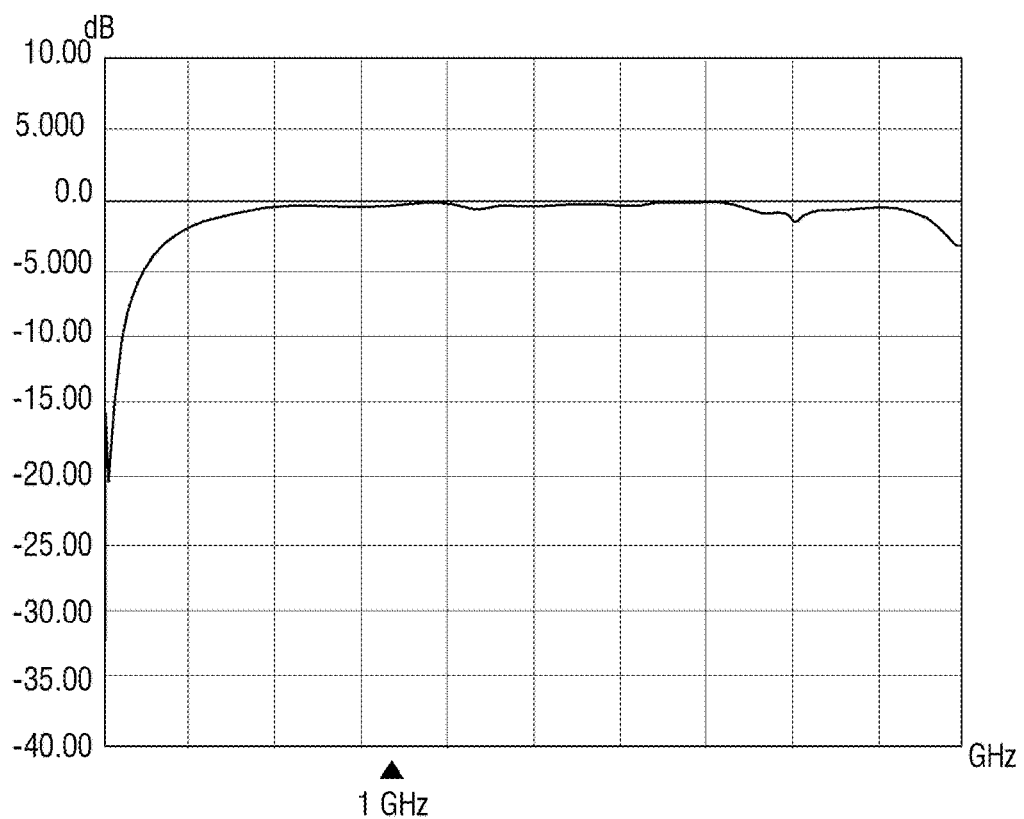

As illustrated in FIGS. 9C and 9D, amorphous and nano nitride composite thin films A and B that are formed with a thickness of 1 μm have electromagnetic wave attenuation of a portable terminal that approaches 0 dB in a wide bandwidth including a frequency of 1 GHz. As described above, if the electromagnetic wave transmission rate is equal to or higher than −10 dB, it may be considered that the thin film can transmit the electromagnetic waves.

On the other hand, the amorphous and nano nitride composite thin film according to an embodiment of the present disclosure may exhibit superior anti-corrosion characteristics. That is, since the amorphous and nano nitride composite thin film that is formed on the object to be treated includes nano-grains, which are much smaller than those of a grain boundary that appears in the crystalline alloy thin film and thus exhibits the characteristic that is the same as the characteristic of a glass material, the object to be treated can be effectively protected from an external anti-corrosive environment. In the crystalline alloy thin film having a grain boundary therein, the grain boundary may act as a kind of path for connecting an external environment and an object to be treated to each other, and thus may act as a movement path of corrosive materials, such as moisture, corrosive gas, and corrosive solution. In contrast, since atoms in the amorphous and nano nitride composite thin film have a short-range arrangement of a nanometer level and thus a corrosive path, such as the grain boundary, does not exist, the corrosion speed thereof is considerably lower than that of the crystalline alloy having the same composition. Since the corrosive path hardly exists in the amorphous and nano nitride composite thin film according to the present disclosure, an effect of isolating the corrosive environment from the object to be treated is significantly improved to effectively increase the anti-corrosion.

Further, since the amorphous and nano nitride composite thin film have high hardness, as described above, even if the film is deposited with a thickness of several tens of nanometers, the film may have an anti-scratch property. Accordingly, even if an object to be treated has a fine structure, such as hair lines, formed therein, the amorphous and nano nitride composite thin film can maintain its structure to form a protection layer.

Figure 10:
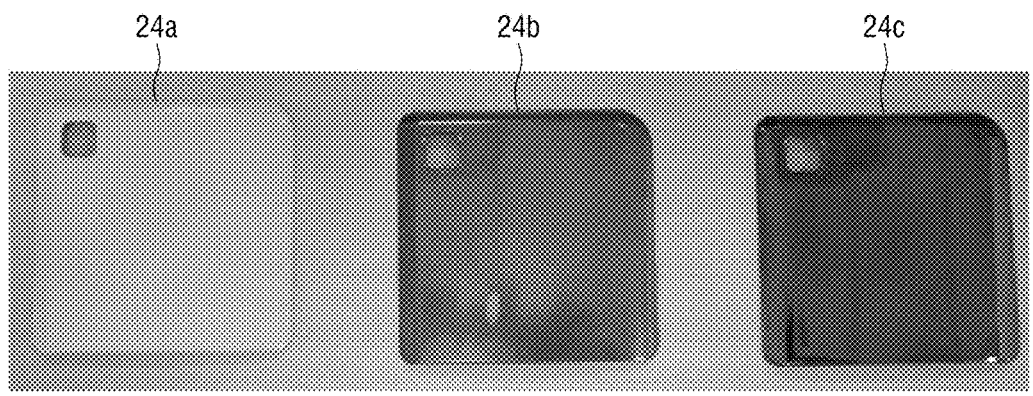
FIG. 10 illustrates a plastic portable phone back cover on which an amorphous and nano nitride composite thin film according to an embodiment of the present disclosure is deposited.
Figure 11:
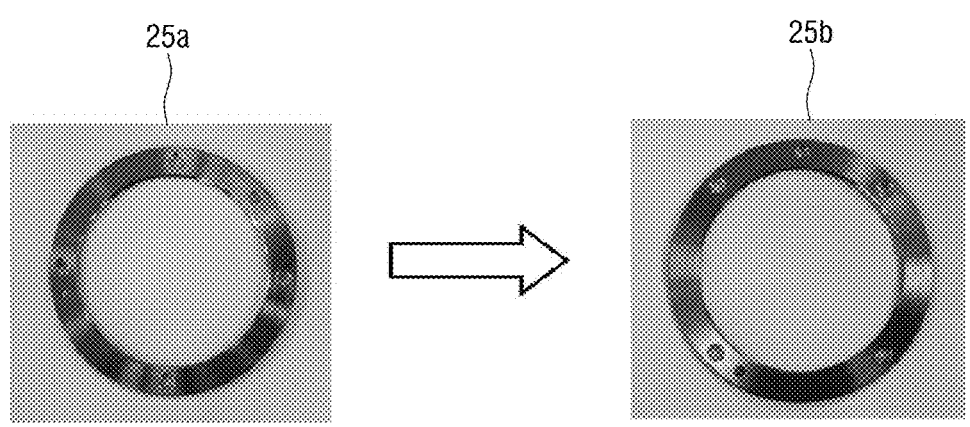
FIG. 11 illustrates a camera mount plate on which an amorphous and nano nitride composite thin film according to an embodiment of the present disclosure is deposited.
Figure 12:
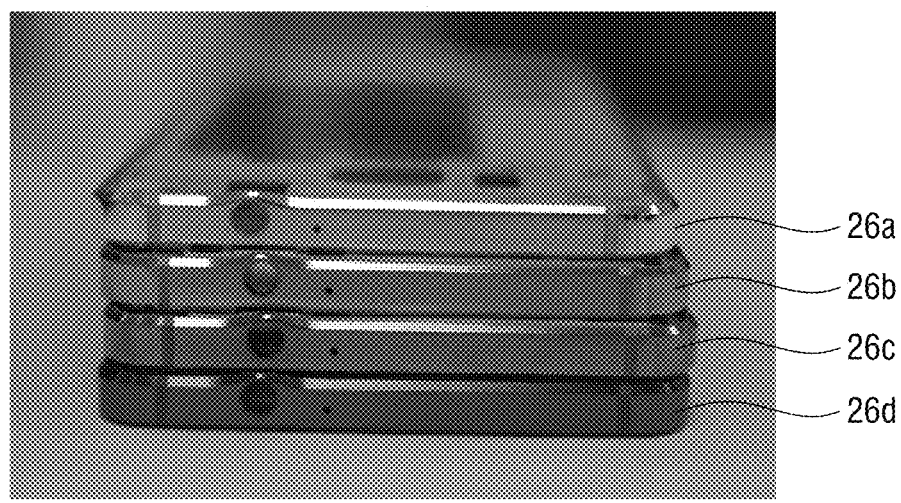
FIG. 12 illustrates a metal portable phone frame on which an amorphous and nano nitride composite thin film according to an embodiment of the present disclosure is deposited.

FIG. 10 is a view illustrating a plastic portable phone back cover on which an amorphous and nano nitride composite thin film according to an embodiment of the present disclosure is deposited, and FIG. 11 is a view illustrating a camera mount plate on which an amorphous and nano nitride composite thin film according to an embodiment of the present disclosure is deposited. FIG. 12 is a view illustrating a metal portable phone frame on which an amorphous and nano nitride composite thin film according to an embodiment of the present disclosure is deposited.

As illustrated in FIG. 10, it can be confirmed that a portable phone back cover 24c having a gold color may be manufactured through a deposition process of an amorphous and nano nitride composite thin film from the existing portable phone back covers 24a and 24b having a white color and a silver color.

As illustrated in FIG. 11, a plate, for example, a camera mount plate 25b having a second color, for example, a gold color may be manufactured through a deposition process of an amorphous and nano nitride composite thin film from the existing camera mount plate 25a having a first color, for example, silver color.

As illustrated in FIG. 12, frames, for example, a metal gold-colored portable phone frame 26c and a metal black-colored portable frame 26d may be manufactured through a deposition process of an amorphous and nano nitride composite thin film from the existing frames metal silver-colored portable frames 26a and 26b having different colors.

Through the adjustment of the volume fraction of the ZrN crystalline phase, the amorphous and nano nitride composite thin film may have a gold or black color and thus can contribute to the increased visibility. A volume fraction of the ZrN crystalline phase can be determined through adjustment of a ratio of a reaction gas N2 to Ar. Since the device has a gold or black color, visibility is better than that of the device that is colored by an existing method, and the color can be maintained for a longer time. According to an exemplary embodiment of the present invention, unlike the existing prints or coatings that are formed on an upper portion of a non-metal film and thus easily peel off, the amorphous and nano nitride composite thin film can be semi-permanently maintained for a long term.

While the present disclosure has been described with reference to certain embodiments thereof, it will be understood by those skilled in the art that various changes in form and detail may be made therein without departing from the spirit and scope of the present disclosure.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. An amorphous and nano nitride composite thin film having a composite structure in which a nitride phase that includes Zr and Al as nitride constituent elements and at least one metal phase are mixed,
wherein the at least one metal phase includes at least one element selected from a group including Cu and Ni,
the nitride phase includes a ZrN crystalline phase in which a size of a grain is in a range of 10 nm to 500 nm, and
a volume fraction of the amorphous and nano nitride composite thin film that is the ZrN crystalline phase in which the size of the grain is in the range of 10 nm to 500 nm is 10% or more.

2. The amorphous and nano nitride composite thin film as claimed in claim 1, wherein the volume fraction of the amorphous and nano nitride composite thin film that is the ZrN crystalline phase in which the size of the grain is in the range of 10 nm to 500 nm is in a range of 10% to 62.5%.

3. The amorphous and nano nitride composite thin film as claimed in claim 2, wherein the volume fraction of the amorphous and nano nitride composite thin film that is the ZrN crystalline phase in which the size of the grain is in the range of 10 nm to 500 nm is in a range of 25% to 40%.

4. The amorphous and nano nitride composite thin film as claimed in claim 2, wherein the volume fraction of the amorphous and nano nitride composite thin film that is the ZrN crystalline phase in which the size of the grain is in the range of 10 nm to 500 nm is in a range of 50% to 62.5%.

5. The amorphous and nano nitride composite thin film as claimed in claim 1, wherein the volume fraction of the amorphous and nano nitride composite thin film that is the ZrN crystalline phase in which the size of the grain is in range of 10 nm to 500 nm is at least 25%.

6. The amorphous and nano nitride composite thin film as claimed in claim 1, wherein the at least one metal phase of the amorphous and nano nitride composite thin film further includes at least one element selected from a group including Cr, Mo, Si, Nb, Co, Sn, In, Bi, Zn, V, Hf, Ag, Ti, and Fe.

* * * * *